(12) United States Patent
Dusemund et al.

(10) Patent No.: US 6,338,743 B1
(45) Date of Patent: Jan. 15, 2002

(54) BUFFER SOLUTIONS FOR SUSPENSIONS USED IN CHEMICAL-MECHANICAL POLISHING

(75) Inventors: Claus Dusemund, Spiesen-Elversberg; Rudolf Rhein, Heppenheim; Manuela Schweikert, Seeheim-Ober Beerbach; Martin Hostalek, Darmstadt, all of (DE)

(73) Assignee: Merck Patent Gesellschaft mit beschrankter Haftung (DE)

( * ) Notice: Subject to any disclaimer, the term of this patent is extended or adjusted under 35 U.S.C. 154(b) by 0 days.

(21) Appl. No.: 09/403,098

(22) PCT Filed: Apr. 15, 1998

(86) PCT No.: PCT/EP98/02209

§ 371 Date: Apr. 3, 2000

§ 102(e) Date: Apr. 3, 2000

(87) PCT Pub. No.: WO98/47976

PCT Pub. Date: Oct. 29, 1998

(30) Foreign Application Priority Data

Apr. 17, 1997 (DE) .......................................... 197 15 975

(51) Int. Cl.[7] .............................. C09G 1/00; C09G 1/02; C09G 1/04
(52) U.S. Cl. .............................. 51/307; 51/308; 51/309; 106/3; 438/692; 423/335
(58) Field of Search .......................... 51/307, 308, 309; 106/3; 438/692, 693; 423/335, 339

(56) References Cited

U.S. PATENT DOCUMENTS

| | | | | |
|---|---|---|---|---|
| 3,715,842 A | * | 2/1973 | Tredinnick et al. | 51/308 |
| 4,260,396 A | * | 4/1981 | Glemza | 51/308 |
| 4,462,188 A | * | 7/1984 | Payne | 51/308 |
| 5,139,571 A | | 8/1992 | Deal et al. | |
| 5,226,930 A | * | 7/1993 | Sasaki | 51/308 |
| 5,230,833 A | * | 7/1993 | Romberger et al. | 51/308 |
| 5,904,159 A | * | 5/1999 | Kato et al. | 51/308 |
| 6,019,806 A | * | 2/2000 | Sees et al. | 51/308 |
| 6,027,669 A | * | 2/2000 | Miura et al. | 106/3 |
| 6,114,249 A | * | 9/2000 | Canaperi et al. | 438/692 |

FOREIGN PATENT DOCUMENTS

| | | |
|---|---|---|
| EP | 0 773 270 | 5/1997 |
| GB | 2 318 998 | 5/1998 |

OTHER PUBLICATIONS

Patent Abstracts of Japan vol. 097, No. 007, Jul. 31, 1997 and JP 09 063996 A (Nippon Steel Corp.), Mar. 7, 1997.

* cited by examiner

*Primary Examiner*—Michael Marcheschi
(74) *Attorney, Agent, or Firm*—Millen, White, Zelano & Branigan, P.C.

(57) ABSTRACT

The present invention relates to buffer systems in the form of solutions or salts for preparing suspensions which can be used for chemomechanical polishing. In particular, these buffer systems can be used for preparing suspensions having a high pH of 9.5–13 which are used for the chemomechanical polishing of Si and metal surfaces of semiconductors, known as wafers.

10 Claims, 2 Drawing Sheets

BUFFER SOLUTIONS FOR SUSPENSIONS USED IN CHEMICAL-MECHANICAL POLISHING

The present invention relates to buffer systems in the form of solutions or salts for preparing suspensions which can be used for chemomechanical polishing. In particular, these buffer systems can be used for preparing suspensions which have a high pH of 9.5–13 and are used for the chemomechanical polishing of Si and metal surfaces of semiconductors, known as wafers.

Typical semiconductor circuits are usually built up using silicon or gallium arsenide as substrate onto which many integrated circuits are applied. The various layers from which these integrated circuits are built up are either conductive, insulating or have semiconductor properties. To build up such a semiconductor structure, it is absolutely necessary for the wafer used to have an absolutely flat surface. It is therefore frequently necessary to polish the surface or part of the surface of a wafer.

Further developments in semiconductor technology have led to ever larger degrees of integration and continuing miniaturization, combined with circuits which are becoming ever narrower, as a result of which ever higher demands are made of the manufacturing methods. For example, in the case of such semiconductor elements, it is necessary to form thin conductive lines or similar structures on previously formed structures. The fact that the surface of the previously formed structures is frequently irregular presents problems. In order to be able to achieve a satisfactory result in the subsequent photolithographic treatment, it is therefore necessary to make the surface planar. For this reason, the methods and agents by means of which the surface is made planar, as is repeatedly necessary, are a central subject in semiconductor production. In technical language, this process is known as chemomechanical polishing. Accordingly, both the industrial equipment used and the chemical components of which the formulations of the polishing suspensions used are composed, as well as the supply systems by means of which the polishing suspensions are provided during polishing, are of great interest in this process step.

In general, chemomechanical polishing (CMP) is carried out by rotating the wafer under uniform pressure against a polishing cloth which is uniformly impregnated with a polishing suspension. Such processes for chemomechanical polishing are described in more detail in U.S. Pat. Nos. 4,671,851, 4,910,155 and 4,944,836.

To achieve consistent results, constant chemical properties of the suspensions, known as slurries, used for polishing are of great importance. These are usually dilute suspensions which are brought from the reservoirs to the point at which polishing takes place via lines which are as short as possible, if desired with mixing. The requirement for constant properties of these slurries applies in particular to the content of solids, which normally consist of silicate or aluminium oxide particles, the size distribution of the solid particles, the pH and also other ions present therein; solid particles and pH appear to have a particular influence on the polishing result, even if the content of ions, e.g. set free from the storage containers, supply systems or by decomposition processes within the slurries themselves, would likewise not seem negligible. Furthermore, undesired agglomerate, aggregate or gel formation in the slurries can occur and can have an adverse effect both on their handling and on the polishing result.

The polishing suspensions can be either basic or acid suspensions. Basic slurries have different problems in use depending on which base has been used for adjusting the pH. The slurries whose pH has been adjusted by means of KOH appear to be more stable as such, but have higher degrees of contamination by ions and foreign particles, so that the cleaning steps subsequent to polishing are of considerably greater importance when such systems are used. For example, U.S. Pat. No. 5,245,790 describes the use of such suspensions under the action of ultrasound. U.S. Pat. No. 5,244,534 discloses a process for producing a conductive contact in an insulating layer. The slurries described therein, which comprise, for example, $Al_2O_3$ as solid particles, hydrogen peroxide as etchant and either KOH or $NH_4OH$ for adjusting the pH, are used in a first polishing step in order to remove tungsten in a predetermined amount and at the same time take off only very little of the insulating layer. The subsequent chemomechanical polishing step employs a suspension which consists of a solid such as $Al_2O_3$, an oxidizing agent such as hydrogen peroxide and water. The CMP suspensions disclosed in U.S. Pat. No. 5,209,816 also have similar compositions comprising phosphoric acid, hydrogen peroxide, water and solid particles, while U.S. Pat. No. 5,157,876 and U.S. Pat. No. 5,137,544 disclose compositions comprising water, colloidal silicate and sodium hypochlorite. U.S. Pat. No. 4,956,313 describes slurries comprising aluminium oxide particles, deionized water and an oxidizing agent.

In contrast to formulations whose pH has been adjusted using KOH, the problem of contamination by foreign ions is less in the case of CMP suspensions to which ammonia solution has been added for this purpose, but they are more likely to display gel formation and the pH is more likely to change. In addition, the odour plays a particular role here.

Although such formulations have been used for some time both for making wafers planar and for polishing metal coatings, films and conductive contacts, the results achievable with the CMP slurries used hitherto are frequently unsatisfactory, since the properties of the CMP suspensions are changed during polishing by dissolution processes and small solid particles removed from the polished surfaces. A particular problem is caused if the pH changes during the polishing process, especially since this is associated with a change in the rate of material removal.

There has therefore for some time been a considerable need for improved, inexpensive and simple-to-prepare suspensions for chemomechanical polishing, by means of which both surfaces of substrate materials and of metal layers can be made absolutely flat without undesired contamination and surface defects.

The object of the invention is achieved by means of buffer systems comprising 3–25% by weight of silica in a 0.5–10 molar aqueous solution of a strong base selected from the group consisting of TMAH, KOH or NaOH. They are effective in the pH range from 9.5 to 13.

The object of the invention is also achieved by a process for preparing the buffer system mentioned, characterized in that a 3–25% aqueous silica solution or $SiO_2$ suspension is treated while mixing well, if desired with warming, with such an amount of an aqueous solution of a strong base selected from the group consisting of TMAH, KOH or NaOH that the buffer solution effective in the pH range from 9.5 to 13 comprises from 0.5 to 10 mol/l of the strong base.

According to the invention, if desired, the water is removed from the buffer solution obtained, giving the salt of the buffer system. This can be achieved by removing the water by evaporation under reduced pressure or by crystallizing out the salt of the buffer by subsequent cooling and separating off the resulting crystals. This salt can then, dissolved in an aqueous suspension or solution, buffer the suspension in the strongly alkaline range.

The invention thus also provides for the use of this buffer system prepared by the process of the invention for preparing alkaline suspensions having a pH of from 9.5 to 13 for chemomechanical polishing, in particular of silicon or other metal surfaces.

According to the invention, the buffered suspensions can comprise, as abrasives, metal oxides in the form of solid particles selected from the group consisting of silicon oxide and aluminium oxide, and oxidizing agents and, if desired, further additives.

It has now been found that the stability of alkaline suspensions for chemomechanical polishing can be increased by buffering in the pH range from 9.5 to 13. This is important, since the pH changes the ion layers on the wafer surface and therefore influences the rate of material removal during polishing. Basic slurries also have higher rates of material removal. This can be attributed to the fact that when making Si and other metal surfaces, e.g. Al, Ti, W or Cu, planar, the metal has to be dissolved by an oxidizing process. The removal of silicon in alkaline solution is an $OH^-$ consuming reaction which has the highest reaction rate at high pH values. To allow the removal of material to proceed for as long as possible under optimum conditions during chemomechanical polishing, the pH should be kept as constant as possible at a high level. The buffering by $K_2CO_3$ which is usually used in this pH range has been found to be less suitable when the suspensions are used according to the invention, since buffering at a pH of 10.33 can be achieved thereby. If values above this are set, the pH quickly drops back to 10.33.

If attempts are made to keep the pH as constant as possible by regular addition of a strong base to the suspension, the suspension system experiences a considerable change in the pH at the mixing boundary. In the case of an $SiO_2$ suspension, this leads to a reaction and an associated change in the particle size distribution of the generally very small silicate particles.

It has been found by experiment that this problem can be avoided by setting the pH by means of a suitable buffer solution.

While buffer systems which are effective in the pH range of 11–13 and are based on phosphate and borate ions have proved to be unsuitable, silica-containing systems have been found to be ideal. Such suspensions have particularly advantageous properties if the buffering is carried out by means of a TMAH-containing silica buffer (TMAH= tetramethylammonium hydroxide) and silicate particles are used as polishing medium. Such formulations make it possible, in particular, to avoid undesired contamination by foreign ions since no further metal ions are present in the CMP suspension.

Improved stabilities and polishing properties are displayed by CMP suspensions containing from about 5 to 15% by weight of silicate particles as polishing medium if the pH is set and buffered using buffer solutions in which from about 3 to 25% by weight of silica are present in a 0.5–10 molar solution of a strong base selected from the group consisting of TMAH, NaOH and KOH. Suspensions comprising from 5 to 30% by weight of silicate particles are particularly suitable. Buffer solutions comprising from about 5 to 12% by weight of silica in a 5.0–7.5 molar TMAH solution are very particularly suitable for setting the pH.

Apart from the silicate particles as polishing medium, the suspensions according to the invention can comprise oxidizing agents for oxidizing metal layers to the corresponding metal oxides, for example tungsten to tungsten oxide. The oxide formed is then removed mechanically by the polishing. For this purpose, it is possible to use a wide variety of chemicals such as appropriate oxidizing metal salts, oxidizing metal complexes, iron salts such as nitrates, sulphates, potassium ferrocyanide and similar salts, peroxides, chlorates, perchlorates, permanganates, persulphates and mixtures thereof. Preference is given to using those oxidizing agents which are most compatible with the surfaces to be treated in the specific application. Hydrogen peroxide is therefore preferably employed as oxidizing agent, provided that it is usable and suitable. The concentration of the oxidizing agent is usually selected to be such that rapid oxidation is ensured but at the same time the mechanical removal of the oxides is also ensured, i.e. that the oxidation is in equilibrium, with the mechanical polishing. The concentration of the oxidizing agent is usually from 0.5 to 15% by weight, based on the total suspension, preferably from 1 to 7% by weight.

For stabilization and to improve the polishing result, the CMP suspensions according to the invention can also comprise further additives such as agents to prevent sedimentation or flocculation of the particles or decomposition of the oxidizing agent and a series of additives such as surfactants, complexing agents, polymeric stabilizers or surface-active dispersants, as already mentioned above. Corresponding suitable additives such as aluminium salts, carboxylic acids, alcohols, EDTA, citrates, sodium salts, potassium salts, ammonium salts, quaternary ammonium salts, phosphonium salts, are generally known to a person skilled in the art from the literature. If necessary, these additives are usually used in an amount of from 0.001 to 10% by weight. Of course, the concentrations selected in each case will be concentrations which, on the one hand, improve the result of the chemomechanical polishing and, on the other hand, do not lead to any disadvantages, e.g. foaming when surfactants are added.

To prepare the CMP suspensions buffered according to the invention, the particulate silicon oxides, if desired of different particles size, are mixed in the desired amount with deionized water to produce a colloidal dispersion. A homogeneous dispersion is prepared by mixing under the action of high shear forces as can be generated by very high stirrer speeds or by action of ultrasound, all desired additives are added and the pH of the suspension is set to the desired value in the range from 9.5 to 13 by addition of an appropriate amount of a silica/TMAH buffer, as described above.

In the above description and the following examples, percentages of the added components of the formulations of the invention add up to 100%.

The examples below serve to illustrate the present invention. However, owing to the general validity of the teachings of the invention, they do not restrict the invention to the subject-matter of these examples.

EXAMPLES

Example 1 a) A 10% silicon oxide suspension is prepared. 50 g of this suspension are admixed while stirring intensively with 5 ml of a 20% $K_2Co_3$ solution and 1.1 ml of a 10% KOH solution. In this way, the pH is set to 12.0.
The suspension thus obtained is titrated with 1 normal hydrochloric acid.
b) A 10% silicon oxide suspension is prepared. 50 g of this suspension are admixed while stirring intensively with 15 ml of a buffer TM1 (5.5% by weight of silica, 8% by weight of TMAH). In this way, the pH is set to 12.0.

The suspension thus obtained is likewise titrated for comparison with 1 normal hydrochloric acid.

The results of this titration are shown in FIG. 1. The titration curves shown therein make clear the different behaviour of the suspensions a) and b) towards hydrochloric acid, i.e. buffering of a 10% silicon oxide suspension at pH 12 using a buffer TM1 (5.5% by weight of silica, 8% by weight of TMAH) compared with buffering using a $K_2CO_3$/KOH buffer.

Example 2 a) A 10% silicon oxide suspension is prepared. 50 g of this suspension are admixed while stirring intensively with 5 ml of a 20% $K_2CO_3$ solution and 1.1 ml of a 10% KOH solution. In this way, the pH is set to 12.0

The suspension thus obtained is titrated with 1 normal hydrochloric acid.

b) A 10% silicon oxide suspension is prepared. 50 g of this suspension are admixed while stirring intensively with 4 ml of a buffer TM3 (10% by weight of silica, 14% by weight of TMAH). In this way, the pH is set to 12.0

The suspension thus obtained is likewise titrated for comparison with 1 normal hydrochloric acid.

The results of this titration are shown in FIG. 2. The titration curves shown therein make clear the different behaviour of the suspensions a) and b) towards hydrochloric acid, i.e. buffering of a 10% silicon oxide suspension at ph 12 using a buffer TM3 (10% by weight of silica, 14% by weight of TMAH) compared with buffering using a $K_2CO_3$/KOH buffer.

Figure 1:
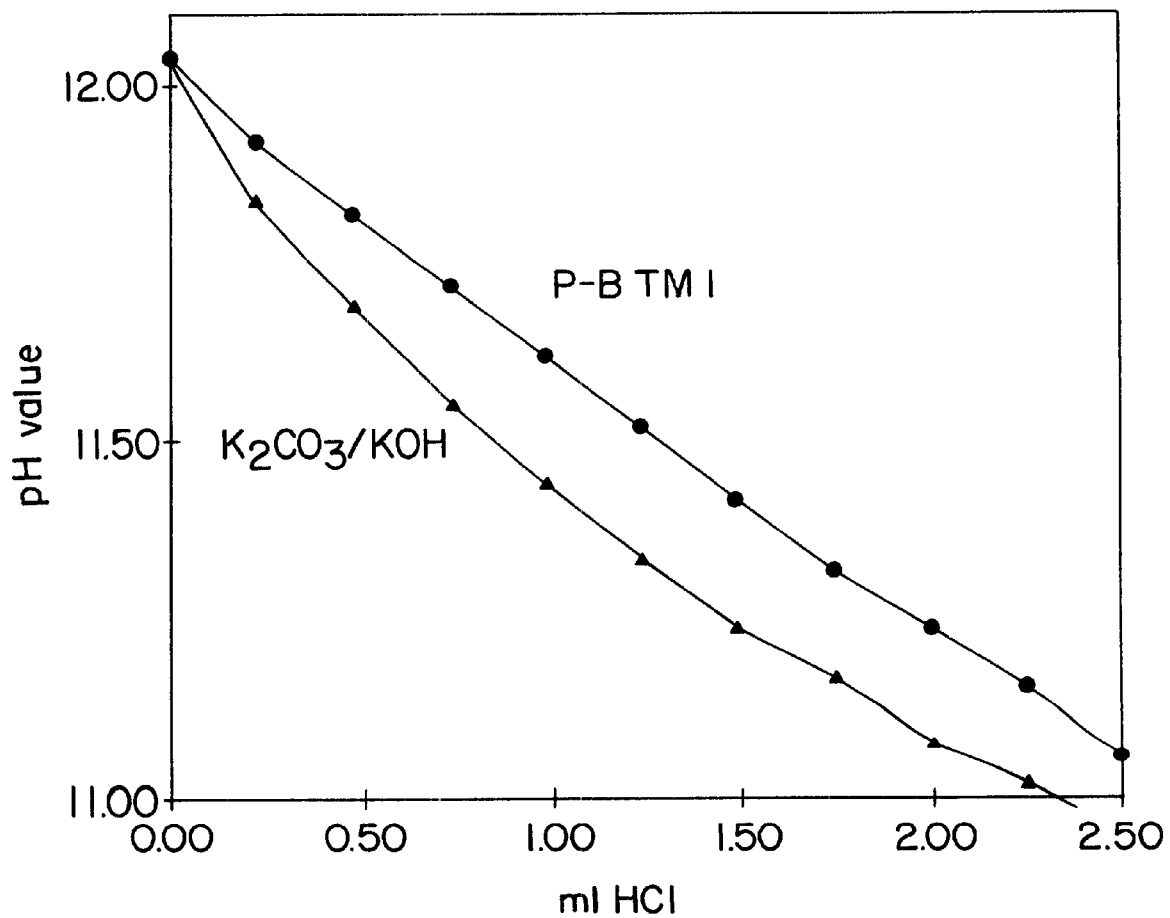
FIG. 1 is a graph of the titration results from Example 1 above.
Figure 2:
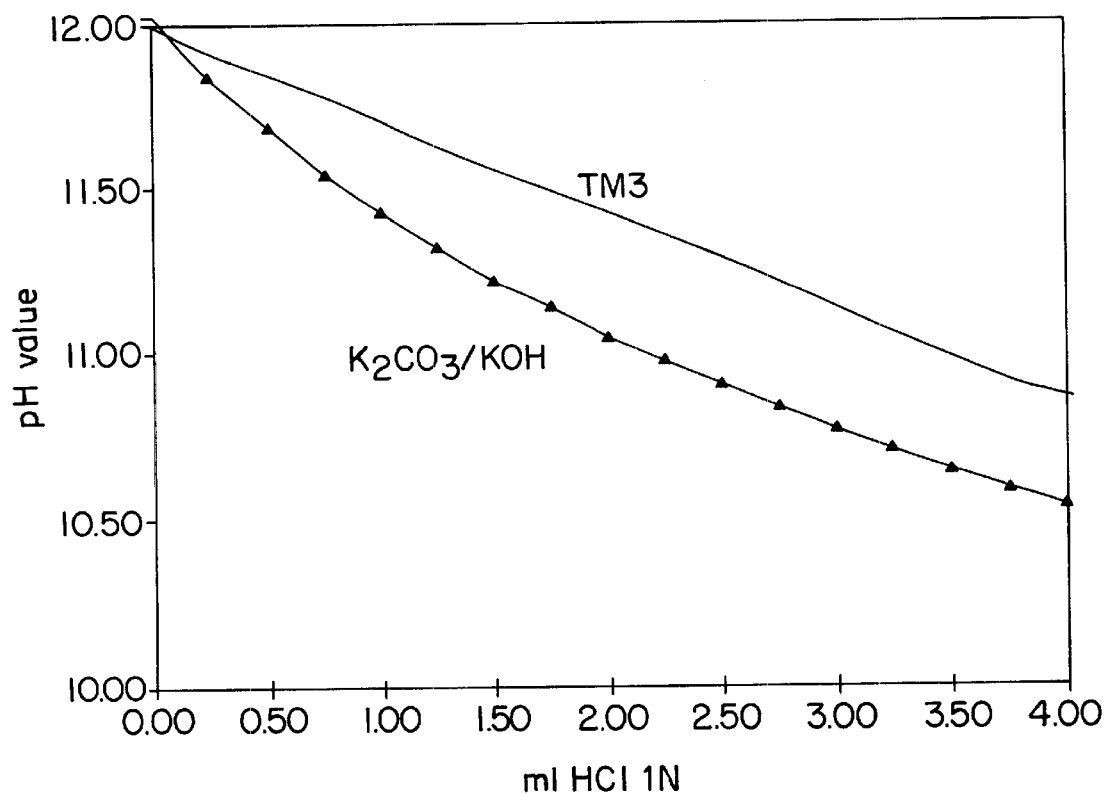
FIG. 2 is a graph of the titration results from Example 2 above.

What is claimed is:

1. A process for preparing a salt of a buffer system, wherein the process comprises:

treating, while mixing well and, optionally, with warming, a 3–25% by weight aqueous silica solution with an amount of an aqueous base solution comprising from 0.5 to 10 mol/l of a strong base selected from the group consisting of TMAH, KOH or NaOH, to provide a buffer solution effective in the pH range from 9.5 to 13; and removing the water from the buffer solution obtained to give the salt of the buffer system.

2. The process of claim 1, wherein the water is removed from the buffer solution by evaporation under reduced pressure.

3. The process of claim 2, further comprising crystallizing out the salt of the buffer system by subsequent cooling and separating the resulting crystals.

4. The process of claim 1, wherein the silica solution is a 5–12% by weight aqueous silica solution and the aqueous base solution is a 5.0 to 7.5 molar TMAH solution.

5. A method for preparing an alkaline suspension for chemomechanical polishing having a pH of from 9.5 to 13 which comprises buffering the suspension with a salt of a buffer system prepared according to claim 1.

6. The method of claim 5 wherein the alkaline suspension is useful for chemomechanical polishing of silicon or other metal surfaces.

7. The method of claim 5 wherein the alkaline suspension further comprises, as abrasive, at least one metal oxide in the form of solid particles selected from the group consisting of silicon oxide and aluminum oxide, and, optionally, at least one oxidizing agent or further additive.

8. The method of claim 7, wherein the alkaline suspension contains 5 to 30% by weight of silicate particles as abrasive.

9. A method for chemomechanical polishing of a silicon and/or metal surface of a semiconductor wafer which comprises polishing the wafer with an alkaline suspension having a pH of from 9.5 to 13 which is buffered with a salt of a buffer system prepared according to claim 1.

10. A salt of a buffer system prepared by the process of claim 1.

* * * * *